(12) United States Patent
Christensen et al.

(10) Patent No.: US 9,991,199 B1
(45) Date of Patent: *Jun. 5, 2018

(54) INTEGRATED SHIELDING AND DECOUPLING CAPACITOR STRUCTURE

(71) Applicant: International Business Machines Corporation, Armonk, NY (US)

(72) Inventors: Todd A. Christensen, Rochester, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/359,691

(22) Filed: Nov. 23, 2016

(51) Int. Cl.
*H01L 27/108* (2006.01)
*H01L 27/092* (2006.01)
*H01L 49/02* (2006.01)
*H01L 23/522* (2006.01)
*H01L 21/768* (2006.01)
*H01L 23/528* (2006.01)

(52) U.S. Cl.
CPC ...... *H01L 23/5225* (2013.01); *H01L 21/7687* (2013.01); *H01L 21/76802* (2013.01); *H01L 21/76843* (2013.01); *H01L 21/76877* (2013.01); *H01L 23/5226* (2013.01); *H01L 23/5286* (2013.01)

(58) Field of Classification Search
None
See application file for complete search history.

(56) References Cited

U.S. PATENT DOCUMENTS 6,222,260 B1   4/2001   Liang et al.
6,962,846 B2 * 11/2005   Fishburn ............. H01L 21/7687
                                                                257/E21.019
8,547,681 B2   10/2013   Logan et al.
(Continued)

FOREIGN PATENT DOCUMENTS

WO          9712398 A1     4/1997

OTHER PUBLICATIONS

Wong et al., "Decoupling-Capacitor Planning and Sizing for Noise and Leakage Reduction," IEEE Transactions on Computer-Aided Design of Integrated Circuits and Systems, vol. 26, No. 11, 2007, pp. 2023-2034.

(Continued)

*Primary Examiner* — Alexander Ghyka
(74) *Attorney, Agent, or Firm* — Matthew J. Bussan (57) ABSTRACT

A shielding and decoupling capacitor structure can be fabricated within an integrated circuit (IC) by forming recesses in a top surface of a dielectric layer and forming a trench in a top surface of an intra-metal dielectric portion of a metal layer deposited on the top surface of the dielectric layer. A bottom of the trench exposes the recesses. A bottom of each recess exposes a conductive structure. A first plate may be formed by depositing a conductive liner onto the bottom and side of the recess and onto the bottom and side of the trench. A conformal dielectric film may be deposited onto the first plate within the trench and recesses. A second plate may be formed by depositing an electrically conductive material within the trench and recesses over the conformal dielectric film. The conformal dielectric film electrically insulates the first and second plates from each other.

11 Claims, 6 Drawing Sheets

(56) References Cited

U.S. PATENT DOCUMENTS

| | | | |
|---|---|---|---|
| 8,767,404 B2 | 7/2014 | Khor | |
| 9,214,424 B2* | 12/2015 | Stecher | H01L 23/5225 |
| 9,496,326 B1* | 11/2016 | Christensen | H01L 27/10829 |
| 2006/0255389 A1 | 11/2006 | Maeda | |
| 2009/0073664 A1 | 3/2009 | Winger | |
| 2010/0283116 A1* | 11/2010 | Shimizu | H01L 21/82348 |
| | | | 257/500 |
| 2013/0270675 A1* | 10/2013 | Childs | H01L 23/5226 |
| | | | 257/532 |

OTHER PUBLICATIONS

U.S. Appl. No. 14/884,897 by Christensen et al., entitled "High-Density Integrated Circuit Via Capacitor", filed Oct. 16, 2015, assigned to International Business Machines Corporation.
U.S. Appl. No. 14/977,953 by Christensen et al., entitled "High-Density Integrated Circuit Via Capacitor", filed Dec. 22, 2015, assigned to International Business Machines Corporation.
List of IBM Patents or Patent Applications Treated as Related (dated Nov. 23, 2016).
U.S. Appl. No. 14/884,897, filed Oct. 16, 2015.
U.S. Appl. No. 14/977,953, filed Dec. 22, 2015.

* cited by examiner

INTEGRATED SHIELDING AND DECOUPLING CAPACITOR STRUCTURE

BACKGROUND

The present disclosure relates in general to the field of integrated circuits. More particularly, the disclosure relates to employing a high-density integrated circuit capacitor structure in an integrated circuit containing a DC wire or a power supply wire to shield and decouple the DC wire or the power supply wire.

SUMMARY

Embodiments may be directed towards a method of fabricating, within an integrated circuit (IC), a shielding and decoupling capacitor structure. The method may include forming recesses in a top surface of a dielectric layer and forming a trench in a top surface of an intra-metal dielectric portion of a metal layer deposited on the top surface of the dielectric layer. The trench includes at least one side and a bottom, and the bottom of the trench exposes the recesses. Each recess includes at least one side and a bottom, and the bottom of each recess exposes a conductive structure. The method may also include forming a first plate by depositing a conductive liner onto the at least one side and the bottom of each recess and onto the at least one side and the bottom of the trench. The method may also include depositing a conformal dielectric film onto the first plate within the trench and recesses. The method may also include forming a second plate by depositing an electrically conductive material within the trench and recesses over the conformal dielectric film. The second plate is electrically insulated from the first plate by the conformal dielectric film.

Embodiments may also be directed towards a shielding and decoupling capacitor structure within an IC. The shielding and decoupling capacitor structure may include recesses formed in a top surface of a dielectric layer of the IC, each recess having at least one side and a bottom, and the bottom of each recess exposing a conductive structure. The shielding and decoupling capacitor structure may also include a trench formed in a top surface of an intra-metal dielectric portion of a metal layer of the IC deposited on the top surface of the dielectric layer, the trench having at least one side and a bottom, and the bottom of the trench exposing each of the recesses formed in the dielectric layer. The shielding and decoupling capacitor structure may also include a first plate, electrically conductive and deposited onto at least one side and the bottom of each of the recesses formed in the dielectric layer and onto at least one side and the bottom of the trench formed in the intra-metal dielectric portion of the metal layer. The shielding and decoupling capacitor structure may also include a conformal dielectric film attached to the first plate within the trench and each of the recesses. The shielding and decoupling capacitor structure may also include a second plate, electrically conductive and formed within the trench and each of the plurality of recesses over the conformal dielectric film. The second plate is electrically insulated from the first plate by the conformal dielectric film. The second plate may comprise, for example, a DC signal wire or a power supply wire that runs along the trench.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Integrated circuit chip designs often require a large number of signals that do not need to switch at the chip frequency. These are referred to as "DC" signals. These DC signals are generally set once (or very infrequently) and left alone. Typically, DC signals are not strongly driven due to a lack of a timing target. This may leave DC signals susceptible to coupling noise from neighboring aggressor wires. Because of this, DC signals may need to be re-powered frequently using re-powering buffers to combat noise events. These re-powering buffers consume significant area on a chip and also result in increased leakage power. Also, as integrated circuit design densities increase and switching speeds go up, the need for both dense power supply decoupling capacitors and signal capable capacitors continues to grow.

In accordance with some embodiments of the disclosure, a "via cross-section" may be utilized, plus a metal wire above the via cross-section, to form a shielding or capacitor structure between: (1) the metal wire above the via cross-section and one or more via(s) to the outside of the via cross-section and (2) a metal wire below the via cross-section. The plates of the shielding or capacitor structure may be formed between an electrically conductive liner (which connects to the metal wire below the via cross-section) and a bulk via (and wire fill metallurgy which connects to the metal wire above the via cross-section). The plates of the shielding or capacitor structure may be separated from each other by an intervening conformal dielectric film.

A high-density integrated circuit shielding and decoupling capacitor structure, in accordance with some embodiments of the present disclosure, can be fabricated within an integrated circuit (IC) by forming recesses in a top surface of a dielectric layer and forming a trench in a top surface of an intra-metal dielectric portion of a metal layer deposited on the top surface of the dielectric layer. A bottom of the trench exposes the recesses. A bottom of each recess exposes a conductive structure. A first plate may be formed by depositing a conductive liner onto the bottom and at least one side of each recess and onto the bottom and at least one side of the trench. A conformal dielectric film may be deposited onto the first plate within the trench and recesses. A second plate may be formed by depositing an electrically conductive material within the trench and recesses over the conformal dielectric film. The conformal dielectric film electrically insulates the first and second plates from each other.

In some embodiments, the second plate of the high-density integrated circuit shielding and decoupling capacitor structure may be utilized as a DC signal wire to carry DC signals. Because there is now a shielding conductor (i.e., the first plate) surrounding the DC signal wire on the sides of the wire, there is no coupling from adjacent neighboring aggressor wires. Accordingly, the large number of re-powering buffers, typically used to re-power DC signals in order to combat noise events, can be reduced or eliminated. Also, there may be no coupling from aggressor wires on the level below the DC signal wire.

In some embodiments, the high-density integrated circuit shielding and decoupling capacitor structure may be used on a power supply wire. The increased decoupling capacitance on the power supply wire resulting from the high-density integrated circuit shielding and decoupling capacitor structure can be used to increase overall performance or reduce power.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electrical devices such as digital and analog integrated circuits (ICs).

A decoupling capacitor can be used to decouple or electrically isolate one part of an electrical circuit or network from another part of the circuit. Electrical noise generated by certain circuit elements can be shunted through a decoupling capacitor. Decoupling capacitors can be particularly useful for shunting or bypassing high-frequency noise components around noise-sensitive circuitry such as filters, amplifiers and logic elements.

For ease of discussion, the term "high-density integrated circuit shielding and decoupling capacitor structure" may be used herein. This term, which is also referred to herein using its shortened variant "shielding and decoupling capacitor structure", can be used to refer to a capacitive structure, created according to embodiments of the present disclosure, within an IC, that has significantly higher capacitive density, i.e., capacitance per unit of physical area, than other types of capacitors which may be formed within an IC, and that is effective in shielding and/or decoupling DC wires, power supply wires, and other conductive structure carrying signals that do not need to switch at chip frequency.

The term "conductive structure" may be used herein, referring to an electrical conductor, e.g., a wire or metal plane, formed within a metal layer of an IC. The conductive structure may be used to electrically connect a plate of a high-density integrated circuit shielding and decoupling capacitor structure to a signal, power supply or ground node(s) of circuits within the IC. In some embodiments, a conductive structure may be a metallic post, pillar or through-silicon via (TSV). It may be understood that a planar dielectric layer of an IC, as well as an intra-metal dielectric portion of a metal layer of an IC, may include recesses or trenches used to contain conductors and/or capacitive structures within these layers. The terms "dielectric layer" and "metal layer" may therefore both be used in reference to a single physical layer structure containing both dielectric material and conductive material.

According to embodiments, a high-density integrated circuit shielding and decoupling capacitor structure may provide a large amount of capacitance to provide effective shielding and/or decoupling for a conductive structure carrying signals that do not need to switch at chip frequency (e.g., DC wires and power supply wires) in close proximity to one or more aggressor wires or active electronic devices within an IC. A high-density integrated circuit shielding and decoupling capacitor structure can be formed within existing IC via recesses and an existing wire trench, providing a high capacitive density per unit of dielectric area. Electrical interconnect structures such as wires and vias formed within the IC may be used, in conjunction with a high-density integrated circuit shielding and decoupling capacitor structure, to interconnect the high-density integrated circuit shielding and decoupling capacitor structure to power, ground or signal nodes within the IC. According to embodiments, a high-density integrated circuit shielding and decoupling capacitor structure can be fabricated both within an existing dielectric layer of an IC and within an existing adjacent intra-metal dielectric portion of a metal layer of the IC, using existing and proven IC processes and material sets.

Certain figures herein show only a single high-density integrated circuit shielding and decoupling capacitor structure, however, embodiments may include a plurality of high-density integrated circuit shielding and decoupling capacitor structures. While all figures herein illustrate the principles and features of the present disclosure, they are not necessarily drawn to scale.

Certain embodiments relate to the fabrication of a high-density integrated circuit shielding and decoupling capacitor structure both within a dielectric layer of an IC and within an adjacent intra-metal dielectric portion of a metal layer of the IC. In embodiments, a high-density integrated circuit shielding and decoupling capacitor structure can be fabricated by using existing and proven materials, design techniques and semiconductor fabrication technologies.

Figure 1:
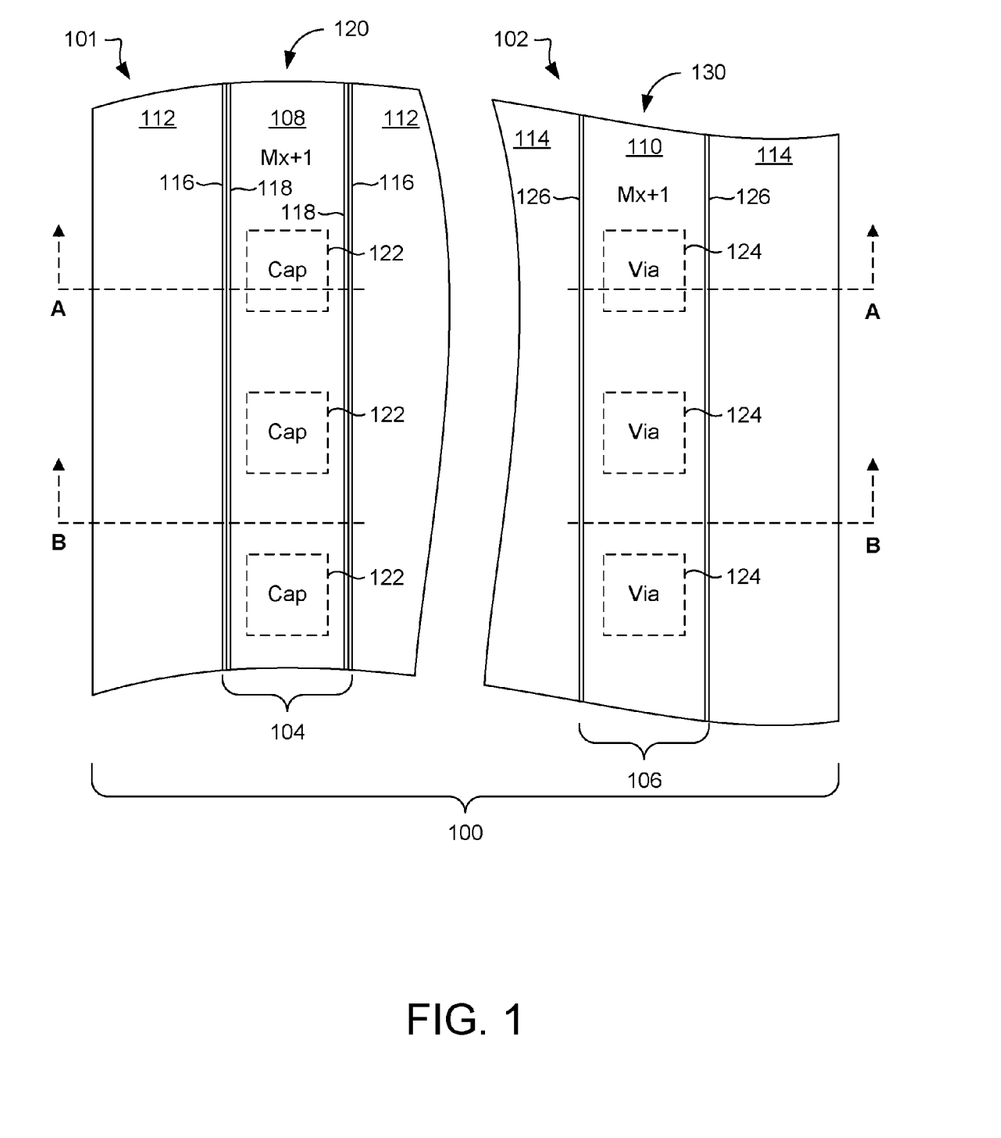
FIG. 1 is a partial, top view illustrating first and second portions of an integrated circuit (IC), in which the first portion includes a high-density integrated circuit shielding and decoupling capacitor structure and the second portion includes a wire and via structure, according to embodiments of the present disclosure.

FIG. 1 is a partial, top view illustrating a first portion 101 and a second portion 102 of an integrated circuit (IC) 100, in which the first portion 101 of the IC 100 includes a high-density integrated circuit shielding and decoupling capacitor structure 104 and the second portion 102 of the IC 100 includes a wire and via structure 106, according to embodiments of the present disclosure. The first and second portions 101, 102 of the IC 100 may be in close proximity to each other within the IC 100 or, alternatively, may be far from each other within the IC 100.

The partial, top view of the first and second portions 101, 102 of the IC 100 illustrated in FIG. 1 is along a planar metal layer Mx+1 of the IC 100. The planar metal layer Mx+1 shown in FIG. 1 is stacked atop a planar dielectric layer (not shown in FIG. 1) of the IC 100. A planar metal layer, such as the planar metal layer Mx+1 shown in FIG. 1, typically includes a plurality of conductive structures (e.g., wires or metal planes) that are separated from each other by intra-metal dielectric portions of the planar metal layer. The metal layer Mx+1 shown in FIG. 1 includes two conductive structures (i.e., a wire 108 in the first portion 101 of the IC 100 and a wire 110 in the second portion 102 of the IC 100) and two intra-metal dielectric portions (i.e., an intra-metal dielectric portion 112 in the first portion 101 of the IC 100 and an intra-metal dielectric portion 114 in the second portion 102 of the IC 100).

In accordance with some embodiments, the wire 108 in the first portion 101 of the IC 100 may be designed to carry signals that do not need to switch at chip frequency (e.g., a DC wire and a power supply wire). In such embodiments, the high-density integrated circuit shielding and decoupling capacitor structure 104 in the first portion 101 of the IC 100 may be effective in shielding and/or decoupling the wire 108, even if the wire 108 is in close proximity to one or more aggressor wires or active electronic devices within the IC 100.

As illustrated in FIG. 1, the high-density integrated circuit shielding and decoupling capacitor structure 104 in the first portion 101 of the IC 100 includes a first plate 116 (only the top left and right edges of which are visible in FIG. 1), a conformal dielectric film 118 (only top left and right edges of which are visible in FIG. 1), and a second plate 120 (only the top surface of which is visible in FIG. 1 as the wire 108). The second plate 120 of the high-density integrated circuit shielding and decoupling capacitor structure 104 includes the wire 108 (within the metal layer Mx+1 of IC 100) and a plurality of capacitive "via" structures 122 (within an underlying dielectric layer of the IC 100). The first plate 116 and the second plate 120 of the high-density integrated circuit shielding and decoupling capacitor structure 104 are electrically insulated from each other by the conformal dielectric film 118 of the high-density integrated circuit shielding and decoupling capacitor structure 104. An exemplary configuration of the capacitive "via" structures 122 within the underlying dielectric layer (not shown in FIG. 1) of the IC 100 is represented in FIG. 1 using dashed lines, each denoted with the label "Cap Via." The configuration of the capacitive plate structures 122 may be similar to the configuration of vias 124, described below, in the second portion 102 of the IC 100.

Only three of the capacitive "via" structures 122 are shown in FIG. 1. Those skilled in the art will appreciate that the second plate 120 may include any number of the capacitive "via" structures 122. Moreover, those skilled in the art will appreciate that the capacitive "via" structures may have other shapes and/or be arranged in other configurations in lieu of, or in addition to, the square shape and the single row configuration shown in FIG. 1.

As illustrated in FIG. 1, the wire and via structure 106 in the second portion 102 of the IC 100 includes an electrically conductive liner 126 (only the top left and right edges of which are visible in FIG. 1) and a conductive structure 130 (only the top surface of which is visible in FIG. 1 as the wire 110). The conductive structure 130 of the wire and via structure 106 includes the wire 110 (within the metal layer Mx+1 of IC 100) and a plurality of vias 124 (within an underlying dielectric layer of the IC 100). An exemplary configuration of the vias 124 within the underlying dielectric layer (not shown in FIG. 1) of the IC 100 is represented in FIG. 1 using dashed lines, each denoted with the label "Via." The configuration of the vias 124 may be similar to the configuration of capacitive "via" structures 122 in the first portion 101 of the IC 100.

Only three of the vias 124 are shown in FIG. 1. Those skilled in the art will appreciate that the wire and via structure 130 may include any number of vias 124. Moreover, those skilled in the art will appreciate that the vias may have other shapes and/or be arranged in other configurations in lieu of, or in addition to, the square shape and the single row configuration shown in FIG. 1.

Figure 2:
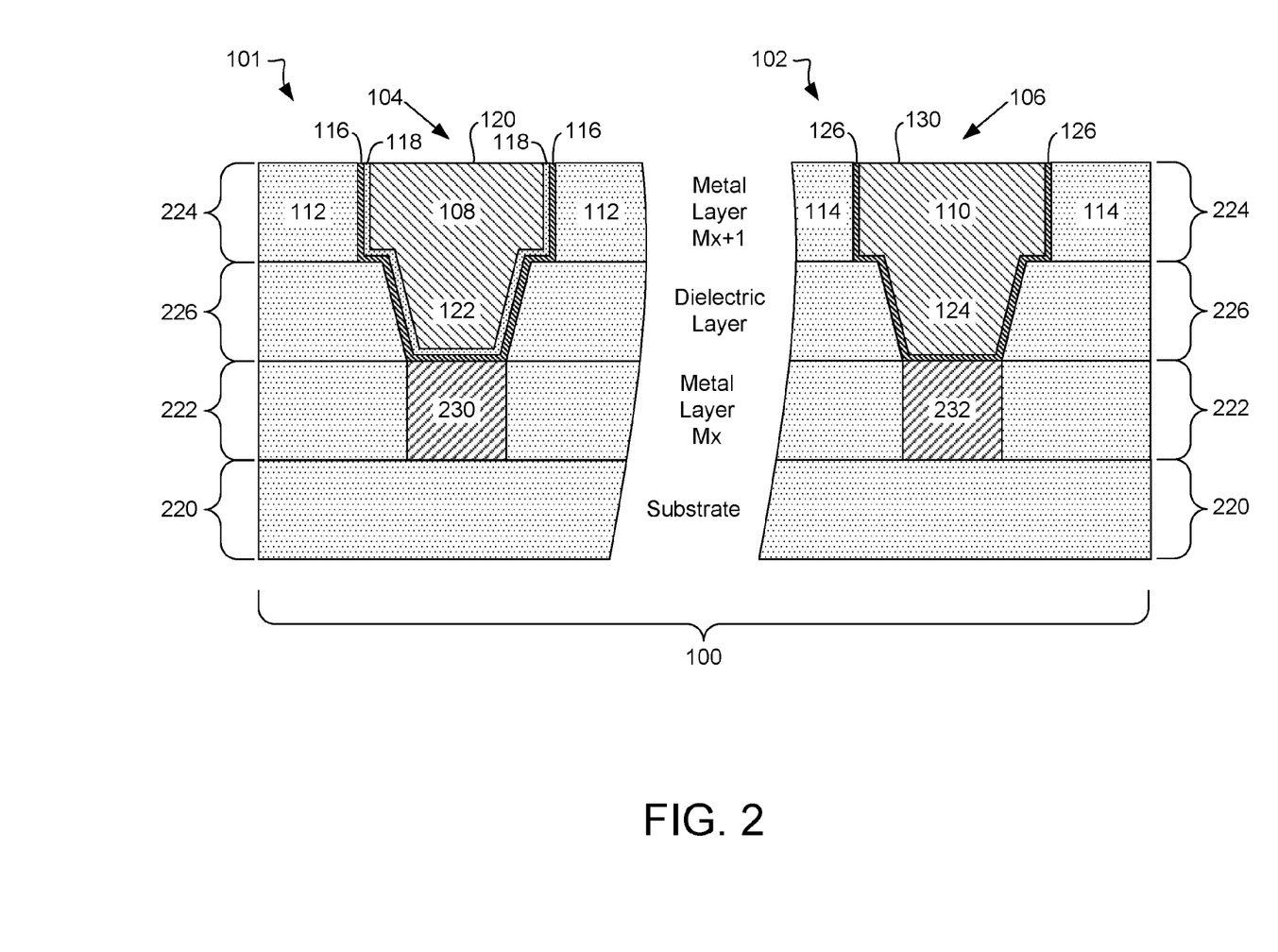
FIG. 2 is a partial, cross-sectional view illustrating the first and second portions of the IC illustrated in FIG. 1, taken along the section line A-A indicated in FIG. 1, according to embodiments of the present disclosure.

FIG. 2 is a partial, cross-sectional view illustrating the first and second portions 101, 102 of the IC 100 illustrated in FIG. 1, taken along the section line A-A indicated in FIG. 1, according to embodiments of the present disclosure.

Figure 3:
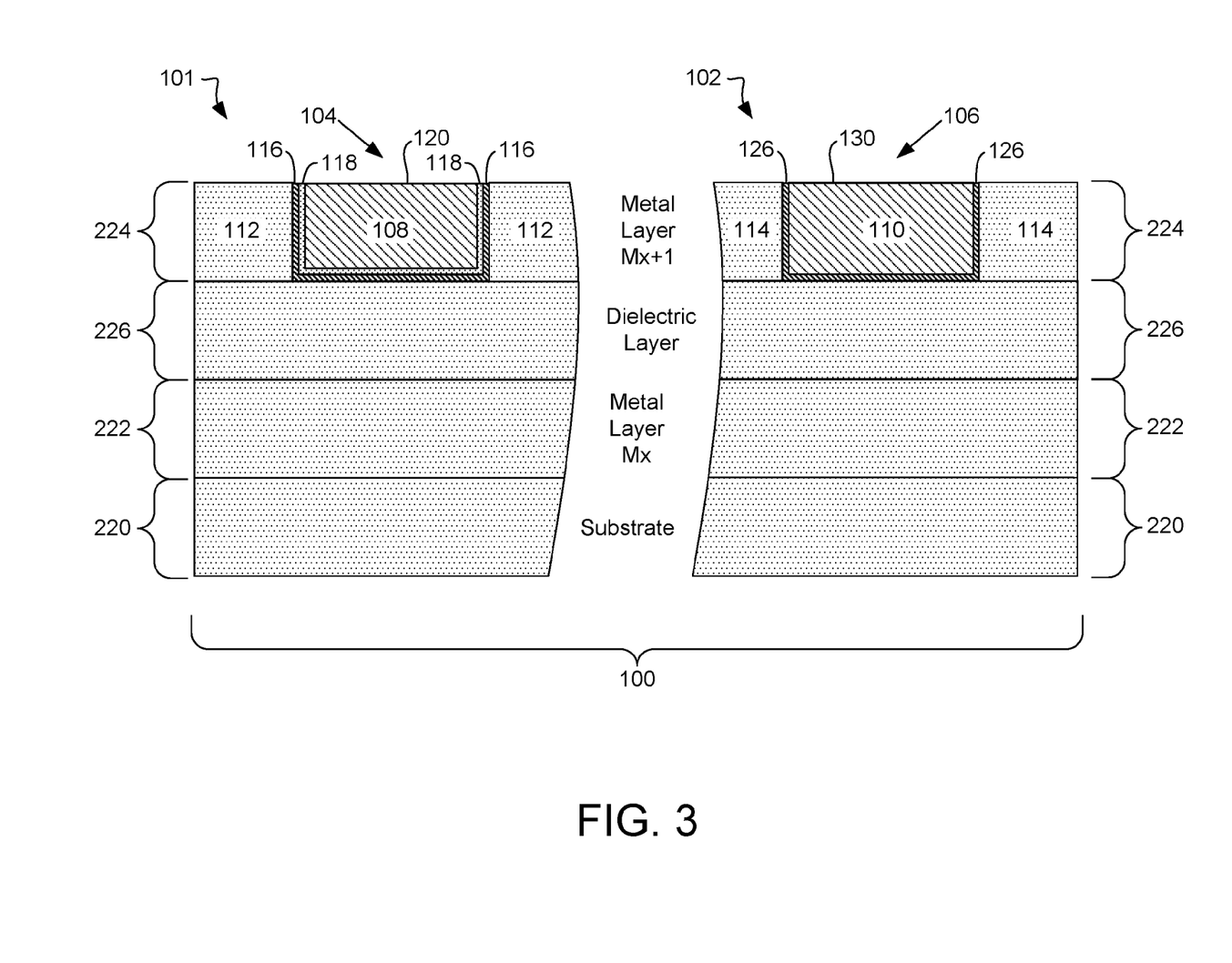
FIG. 3 a partial, cross-sectional view illustrating the first and second portions of the IC illustrated in FIG. 1, taken along section line B-B indicated in FIG. 1, according to embodiments of the present disclosure.

FIG. 3 a partial, cross-sectional view illustrating the first and second portions 101, 102 of the IC 100 illustrated in FIG. 1, taken along section line B-B indicated in FIG. 1, according to embodiments of the present disclosure.

In FIGS. 2 and 3, the first and second portions 101, 102 of the IC 100 each include a substrate 220, two metal layers 222 (Mx), 224 (Mx+1) and a dielectric layer 226, according to embodiments of the present disclosure. The metal layer 224 (Mx+1) shown in FIGS. 2 and 3 corresponds to the metal layer Mx+1 shown in FIG. 1. The substrate 220 can be a thin slice of semiconductor material, such as a silicon crystal, used in the fabrication of ICs, and can have microelectronic devices, such as transistors, fabricated within it.

FIG. 2 includes cross-sectional view, taken along the section line A-A indicated in FIG. 1, of the high-density integrated circuit shielding and decoupling capacitor structure 104 fabricated within the first portion 101 of the IC 100 and the wire and via structure 106 fabricated within the second portion 102 of the IC 100. The results of process operations for fabricating the high-density integrated circuit shielding and decoupling capacitor structure 104 illustrated in FIG. 2 and the wire and via structure 106 illustrated in FIG. 2, according to embodiments of the present disclosure, are respectively illustrated in the flow diagrams of FIGS. 5 and 6.

In the cross-sectional view shown in FIG. 2 (left side), the high-density integrated circuit shielding and decoupling capacitor structure 104 is fabricated both within the metal layer 224 (Mx+1) of the IC 100 and within the dielectric layer 226 of the IC 100, and is interconnected with a first conductive structure 230 formed within the metal layer 222 (Mx) of the IC 100, according to embodiments of the present disclosure. According to embodiments of the present disclosure, the high-density integrated circuit shielding and decoupling capacitor structure 104 includes the conformal dielectric film 118 formed, and providing electrical insulation, between the first plate 116 formed from a conductive liner and a second plate 120 formed from electrically conductive material (i.e., bulk via conductor). The second plate 120 of the high-density integrated circuit shielding and decoupling capacitor structure 104, in the cross-sectional view shown in FIG. 2, includes the wire 108 formed within the metal layer 224 (Mx+1) of IC 100 and the capacitive "via" structure 122 formed within the dielectric layer 226 of the IC 100.

In the cross-sectional view shown in FIG. 2 (right side), the wire and via structure 106 is fabricated both within the metal layer 224 (Mx+1) of the IC 100 and within the dielectric layer 226 of the IC 100, and is interconnected with one or more conductive structures, such as a second conductive structure 232 formed within the metal layer 222 (Mx) of the IC 100, according to embodiments of the present disclosure. According to embodiments of the present disclosure, the wire and via structure 106 includes the electrically conductive liner 126 and the conductive structure 130. The conductive structure 130, in the cross-sectional view shown in FIG. 2, includes the wire 110 and the vias 124 (only a single via 124 is shown in FIG. 2). The wire 110 is formed from electrically conductive material within the metal layer 224 (Mx+1) of the IC 100. The vias 124 are formed are formed from electrically conductive material within the dielectric layer 226. The vias 124 interconnect the wire 110 and one or more conductive structures, such as the second conductive structure 232, through the electrically conductive liner 126.

FIG. 3 includes cross-sectional view, taken along the section line B-B indicated in FIG. 1, of the high-density integrated circuit shielding and decoupling capacitor structure 104 fabricated within the first portion 101 of the IC 100 and the wire and via structure 106 fabricated within the second portion 102 of the IC 100.

In the cross-sectional view shown in FIG. 3 (left side), the high-density integrated circuit shielding and decoupling capacitor structure 104 is fabricated only within the metal layer 224 (Mx+1) of the IC 100, according to embodiments of the present disclosure. According to embodiments of the present disclosure, the high-density integrated circuit shielding and decoupling capacitor structure 104 includes the conformal dielectric film 118 formed, and providing electrical insulation, between the first plate 116 formed from a conductive liner and a second plate 120 formed from electrically conductive material. The second plate 120 of the high-density integrated circuit shielding and decoupling capacitor structure 104, in the view shown in FIG. 3, includes the wire 108 formed from electrically conductive material within the metal layer 224 (Mx+1) of IC 100.

In the cross-sectional view shown in FIG. 3 (right side), the wire and via structure 106 is fabricated only within the metal layer 224 (Mx+1) of the IC 100, according to embodiments of the present disclosure. According to embodiments of the present disclosure, the wire and via structure 106 includes the electrically conductive liner 126 and the conductive structure 130. The conductive structure 130, in the cross-sectional view shown in FIG. 3, includes the wire 110 formed from electrically conductive material within the metal layer 224 (Mx+1) of the IC 100.

In the embodiment depicted in FIGS. 1-3, the high-density integrated circuit shielding and decoupling capacitor structure 104 can be generally used as a circuit element within the IC 100. The high surface area of the first plate 116 and the second plate 120, in conjunction with the high dielectric constant and low thickness of conformal dielectric film 118, can result in the high-density integrated circuit shielding and decoupling capacitor structure 104 having a relatively high capacitance per unit of dielectric area.

In the embodiment depicted in FIGS. 1-3, the wire and via structure 106 can be generally used as a circuit element within the IC 100.

In the embodiment depicted in FIGS. 1-3, the conformal dielectric film 118 is useful in facilitating physical attachment of the second plate 120 to the first plate 116. The capacitance of the high-density integrated circuit shielding and decoupling capacitor structure 104 is substantially determined by the surface area of the first plate 116 that is separated, by the conformal dielectric film 118, from corresponding surface area of the second plate 120. In some embodiments, conductive structures such as vias or wires may be fabricated from an electrically conductive material, e.g., copper, cobalt, tungsten, aluminum or titanium, and used to connect plates 116 and 118 of the high-density integrated circuit shielding and decoupling capacitor structure 104 to additional electrical conductors and circuit elements within the IC 100.

The embodiment depicted in FIGS. 1-3, the high-density integrated circuit shielding and decoupling capacitor structure 104 is created both within a trench formed in the metal layer 224 (Mx+1) and within recesses formed within the dielectric layer 226. In some embodiments, the dimensions of such recesses can be consistent with dimensions of recesses used to form vias (e.g., the vias 124) to interconnect stacked conductive layers within the IC 100. In other embodiments, the dimensions of such recesses can be appreciably larger or smaller than recesses used to form interconnect vias (e.g., the vias 124) within the IC 100.

According to embodiments, a number of physical and electrical parameters can each influence the capacitance value of a high-density integrated circuit shielding and decoupling capacitor structure, which can cause it to be greater than the capacitance value of other types of IC capacitors. These parameters include, but are not limited to, capacitor plate area, the thickness of the dielectric layer and the dielectric constant of the dielectric layer.

In general, the capacitance of a "parallel plate" capacitor having a conductive plate area A and plate separation t is determined in accordance with the following equation:

$$c = \varepsilon \times \frac{A}{t} = k\varepsilon_0 \times \frac{A}{t}$$

Where:
C=capacitance (farad or Coulomb/Volt)
$\varepsilon$=the relative permittivity of the dielectric material used in the capacitor
A=plate area of the capacitive element (m$^2$)
t=distance between the plates or dielectric thickness (m)
k=relative permittivity of the dielectric material between the plates
(k=1 for free space, k≈1 for air, k>1 for all other media,)
$\varepsilon_0$=permittivity of free space=8.854×10$^{-12}$ F/m (farads per meter)

In the embodiment depicted in FIG. 1-3, a portion of the high-density integrated circuit shielding and decoupling capacitor structure 104 is formed in recesses within the dielectric layer 226 of the IC 100. That portion of the high-density integrated circuit shielding and decoupling capacitor structure 104 may be fabricated in any of a myriad of shapes. For example, an exemplary configuration of the capacitive "via" structures 122 within the dielectric layer 226 of the IC 100 is shown in FIG. 1 as having a square-shaped top view. In other embodiments, in accordance with the characteristics of certain IC dielectric material etch processes, the shape of a dielectric layer recess, and thus a portion of the high-density integrated circuit shielding and decoupling capacitor structure formed in the recess, can be consistent with the shape of a conical frustum, for example. The conductive plate area A of a conical frustum-shaped high-density IC capacitor is determined in accordance with the following equation:

$$A = \pi(r_1 + r_2)\sqrt{(r_1 - r_2)^2 + d^2} + \pi(r_2)^2$$

Where:
A=plate area of the first/second plates (m$^2$)
$r_1$=the larger top recess radius (m)
$r_2$=the smaller bottom recess radius (m)
d=recess depth (m)

The equation above includes the total capacitor area (which, for ease of calculation, is only a portion of the high-density integrated circuit shielding and decoupling capacitor structure 104, according to embodiments of the present disclosure—i.e., a single capacitive "via" structure formed in a conical frustum-shaped recess within the dielectric layer 226 of the IC 100) as a sum of the area of the curved perimeter surface plus the area of the bottom of the first conductive liner.

In some embodiments, a capacitive "via" structure formed within the dielectric layer 226 in the IC 100 can have a non-conical shape, such as cylindrical, polygonal or irregular. In such embodiments, the total plate area A of the capacitor can be calculated similarly to the method described above, however, different equation(s) can be used. For example, the conductive plate area A of a cylindrically-shaped high-density IC capacitor is determined by the following equation:

$$A = d*2\pi r + \pi r^2$$

Where:
A=plate area of the first/second plates ($m^2$)
d=recess depth (m)
r=recess radius (m)

The equation above includes the total capacitor area (which, for ease of calculation, is only a portion of the high-density integrated circuit shielding and decoupling capacitor structure 104, according to embodiments of the present disclosure—i.e., a single capacitive "via" structure formed in a cylindrically-shaped recess within the dielectric layer 226 of the IC 100) as a sum of the area of the curved perimeter surface plus the area of the bottom of the first conductive liner.

The plate area A of an example high-density IC capacitor can be calculated by inserting the following parameter values into the conical frustum area formula:

$$r_1 = 35 \text{ nm}, r_2 = 25 \text{ nm, and } d = 500 \text{ nm},$$

resulting in:

$$\text{plate area } A = 47{,}614 \text{ nm}^2$$

By way of comparison, the plate area A of a parallel plate capacitor, occupying the same IC dielectric layer area as a high-density IC capacitor can be calculated as follows:

$$\text{plate area } A = \text{plate width*plate length} = 50 \text{ nm}*50 \text{ nm} = 2{,}500 \text{ nm}^2$$

The ratio ΔA of plate area A of a high-density IC capacitor to the plate area A of a parallel plate capacitor occupying the same IC dielectric layer area can therefore be calculated as:

$$\Delta A = 47{,}614 \text{ nm}^2 / 2{,}500 \text{ nm}^2 = 19.0$$

Referring to the equations above, the relative permittivity of conformal dielectric film 118 can be the relative permittivity, for example, of a deposited film of $HfO_2$. A conformal dielectric film 118 of $HfO_2$ can have a relative permittivity or dielectric constant k of approximately 28. By contrast, the dielectric constant k, for example, of a layer of $SiO_2$ can be approximately 3.9.

The ratio of dielectric constant k of a high-density IC capacitor to dielectric constant k of a parallel plate IC capacitor the can therefore be calculated as:

$$\Delta k = 28/3.9 = 7.2$$

According to embodiments, as described above, the values of ΔA and Δk can have a significant effect on the capacitance and capacitive density of a high-density integrated circuit shielding and decoupling capacitor structure. The increased plate area A, in conjunction with increased dielectric constant k of the conformal dielectric film 118 can be used to create high-density integrated circuit shielding and decoupling capacitor structures having very high capacitive values and capacitive densities.

The parameter value differences ΔA and Δk, as calculated above, can be multiplied together to calculate an estimated difference in capacitance between a high-density IC capacitor and a parallel plate IC capacitor occupying approximately the same area within a dielectric layer. For example:

$$\Delta C = \Delta A * \Delta k$$

Where:
ΔC=ratio of capacitance (high-density capacitor:parallel plate capacitor)
ΔA=plate area ratio (high-density capacitor:parallel plate capacitor)
Δk=dielectric constant ratio (high-density capacitor:parallel plate capacitor)

Using the values calculated above, ΔA=19.0 and Δk=7.2 results in a ΔC, or capacitance ratio between a high-density capacitor and a parallel plate capacitor of 136.8. The values calculated above are directed to a single a high-density capacitor, which is only a portion of the high-density integrated circuit shielding and decoupling capacitor structure 104, according to embodiments of the present disclosure—i.e., a single capacitive "via" structure formed in a recess within the dielectric layer 226 of the IC 100. The high-density integrated circuit shielding and decoupling capacitor structure 104, according to embodiments of the present disclosure, may include a plurality of such capacitive "via" structures formed in a plurality of recesses within the dielectric layer 226 of the IC 100, as well as an additional capacitive structure formed in a trench within the metal layer 224 (Mx+1) of the IC 100.

The calculations herein are example calculations, and actual values of ΔC can vary, based upon particular values of ΔA and Δk. However, the above calculations serve to indicate that substantial increases in both capacitance and capacitive density can be achieved through the use of a high-density integrated circuit shielding and decoupling capacitor structure fabricated according to embodiments of the present disclosure.

Continuing with the example from above, the capacitance of a high-density IC capacitor can be calculated as follows:

$$C = k\varepsilon_0 \times \frac{A}{t}$$

Where:
C=capacitance (farad or Coulomb/Volt)
k=relative permittivity of the dielectric film between the plates (k=28 for $HfO_2$)
$\varepsilon_0$=permittivity of free space=$8.854 \times 10^{-12}$ F/m (farads per meter)
A=plate area of the capacitive element, previously calculated as 47,614 $nm^2$
t=distance between the plates or dielectric thickness=4 nm Solving the above equation using the previously listed parameters yields a nominal a capacitance value of ≈20 fF. A capacitor with these dimensions can be placed, in an IC dielectric layer, at a 50 nm periodicity, so for this example, 400 such capacitors can be placed per 1 $\mu m^2$ of IC dielectric area. Such an arrangement can yield a capacitance of approximately 7.8 pF/$\mu m^2$ or 7.8 uF/$mm^2$ of IC dielectric area. The high-density integrated circuit shielding and decoupling capacitor structure 104, according to embodiments of the present disclosure, may include such an arrangement of capacitive "via" structures formed in a plurality of recesses within the dielectric layer 226 of the IC 100, as well as an additional capacitive structure formed in a trench within the metal layer 224 (Mx+1) of the IC 100.

A variety of physical dimensions, e.g., diameter, depth and conformal dielectric film thickness, and material properties, e.g., a conformal film dielectric constant, can be specified, in embodiments, to create high-density integrated circuit shielding and decoupling capacitor structures having a wide range of capacitance values.

Figure 4:
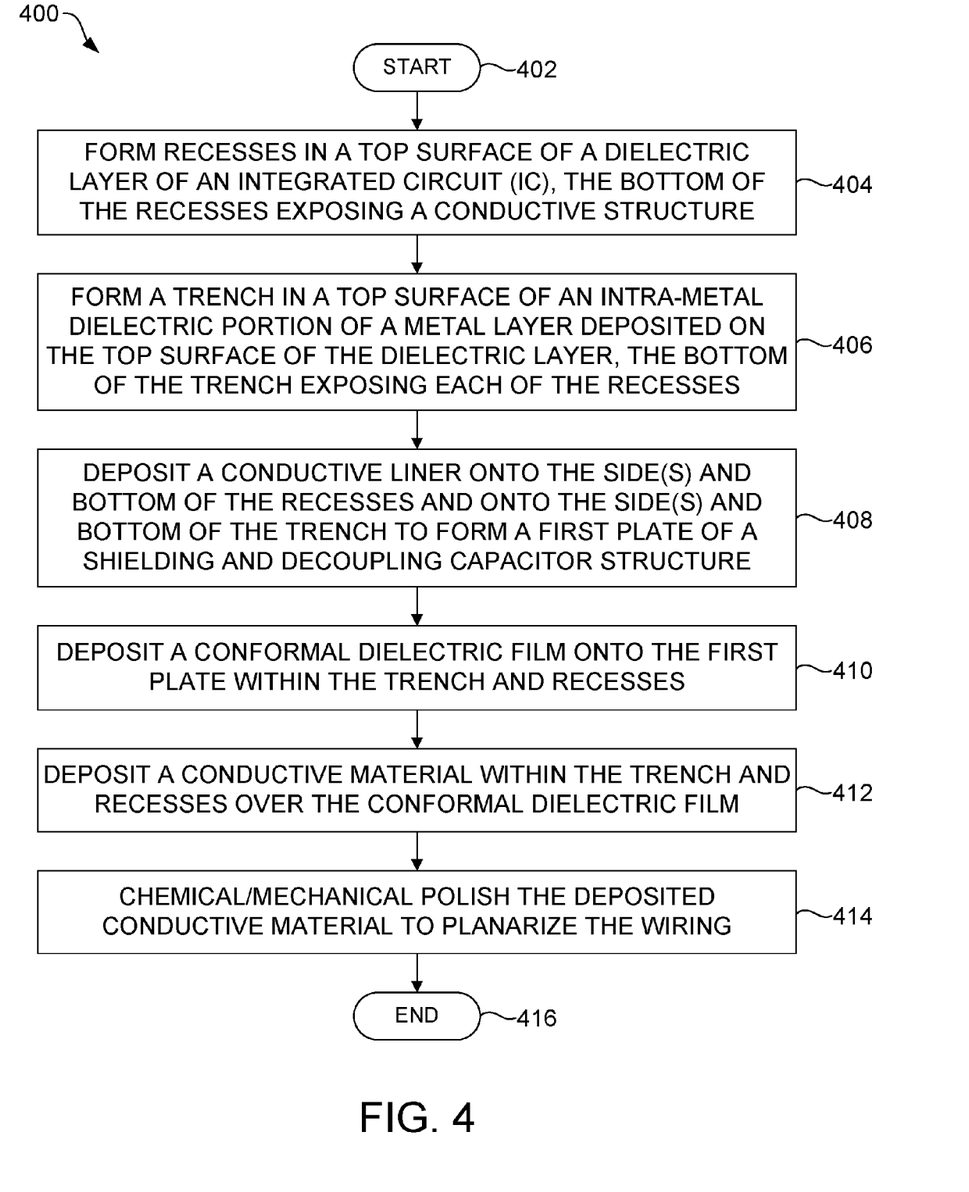
FIG. 4 is flow diagram illustrating a method of fabricating a high-density integrated circuit shielding and decoupling capacitor structure, according to embodiments of the present disclosure.

FIG. 4 is flow diagram illustrating a method 400 of fabricating a high-density integrated circuit shielding and decoupling capacitor structure, according to embodiments of the present disclosure. The method 400 can be useful in creating an IC shielding and decoupling capacitor structure that has a relatively high capacitive density per unit of dielectric area, and that is compatible with existing IC material sets and fabrication technologies.

Figure 5:
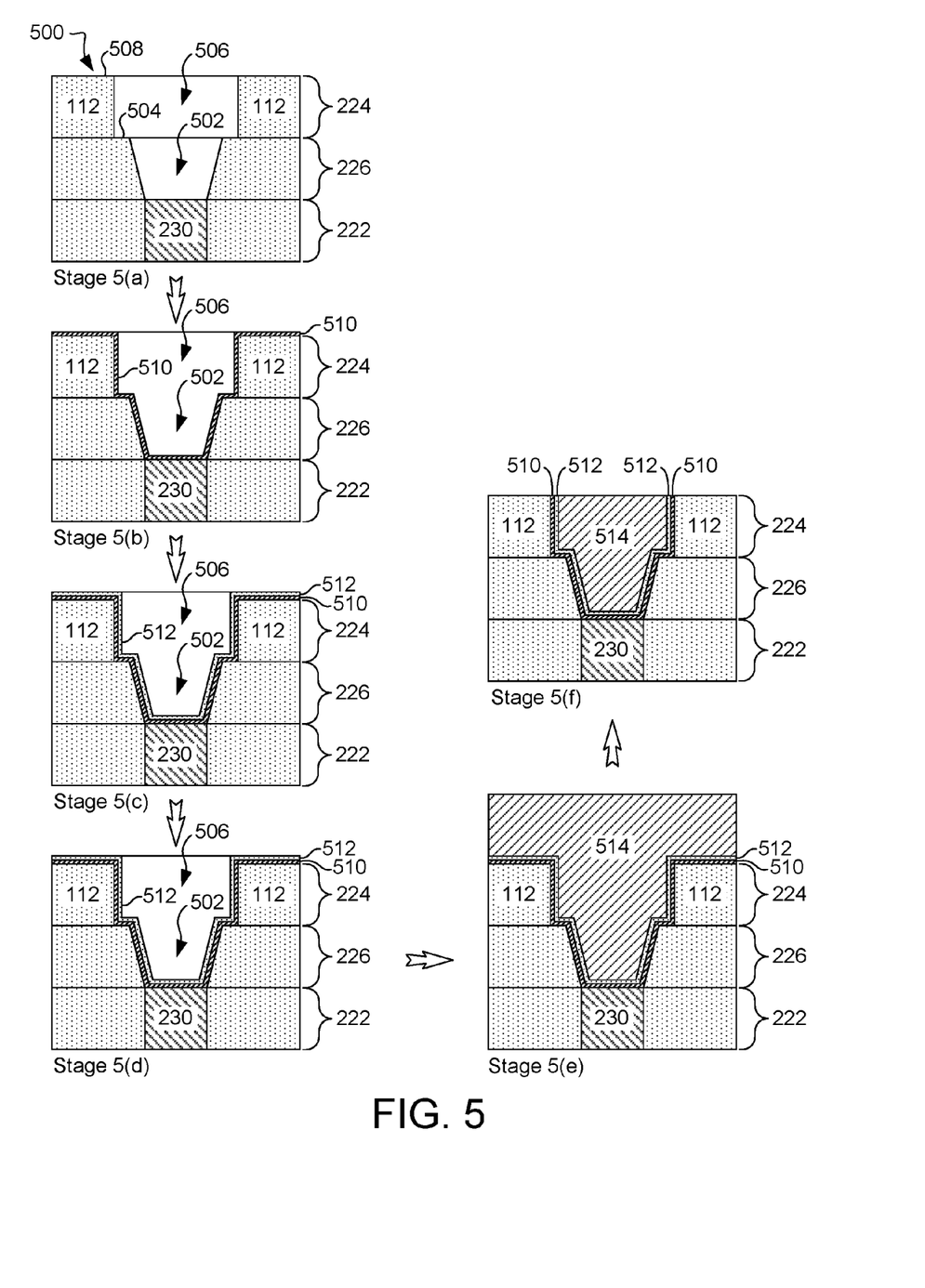
FIG. 5 is a flow diagram illustrating, using successive partial cross-sectional views through stages 5(a)-5(f), the results of process operations for fabricating the high-density integrated circuit shielding and decoupling capacitor structure illustrated in FIG. 2 (left side), according to embodiments of the present disclosure.

The operations described herein in reference to the method 400 generally correspond to the view of the high-density integrated circuit shielding and decoupling capacitor structure illustrated in stages 5(a)-5(f), FIG. 5, and the associated descriptions of those stages.

The process 400 moves from start 402 to operation 404. Operation 404 generally refers to the operation(s) that involve forming recesses in a top surface of a dielectric layer of an IC, which may correspond to the view of the high-density integrated circuit shielding and decoupling capacitor structure illustrated in stage 5(a), FIG. 5, and the associated descriptions of that stage.

Each recess formed through an etching process includes at least one side and a bottom, which may be useful as a location to form a first plate of the high-density integrated circuit shielding and decoupling capacitor structure. Dimensions of the recesses, including width/diameter, length and depth, may be calculated and specified, in conjunction with the dimensions of a trench formed in operation 406, discussed below, in order to form a capacitor structure having a specified target capacitance value. In some embodiments, dimensions of the recesses can be consistent with dimensions of recesses used to form vias for interconnecting conductive layers within an IC. According to embodiments, the dielectric layer is etched to expose a first electrically conductive connector structure at the bottom of each recess. Once the recesses have been formed in the top surface of the dielectric layer, the process 400 moves to operation 406.

Operation 406 generally refers to the operation(s) that involve forming a trench in a top surface of an intra-metal dielectric portion of a metal layer (e.g., Mx+1) of an IC deposited on the top surface of a dielectric layer of the IC, which may correspond to the view of the high-density integrated circuit shielding and decoupling capacitor structure illustrated in stage 5(a), FIG. 5, and the associated descriptions of that stage.

The trench formed through an etching process includes at least one side and a bottom, which may be useful as a location to form a first plate of the high-density integrated circuit shielding and decoupling capacitor structure. Dimensions of the trench, including width/diameter, length and depth, may be calculated and specified, in conjunction with the dimensions of the recesses formed in operation 404, in order to form a capacitor structure having a specified target capacitance value. In some embodiments, dimensions of the trench can be consistent with dimensions of a trench used to form wires within a metal layer of an IC. According to embodiments, the intra-metal dielectric portion of the metal layer is etched to expose each of the recesses formed in the top surface of the underlying dielectric layer of the IC at the bottom of the trench.

In operation 406, the intra-metal dielectric portion of the metal layer (e.g., Mx+1) of an IC may be deposited on the top surface of a dielectric layer of the IC using process operations well known to those skilled in the art. This can involve, for example, depositing or growing a layer of dielectric material (i.e., the intra-metal dielectric portion of the metal layer (e.g., Mx+1) of the IC) on the top surface of a dielectric layer of the IC. According to process operations used in IC fabrication, photolithographic techniques involving the use of photomasks and photoresist can be employed in operation 406 (e.g., within the recesses formed in operation 404) in order to restrict an area for the deposition of the intra-metal dielectric portion of the metal layer (e.g., Mx+1) of the IC. Forming the trench can involve etching this dielectric material. Once the trench has been formed in the top surface of the intra-metal dielectric portion of the metal layer (e.g., Mx+1) of the IC, the process 400 moves to operation 408.

Operation 408 generally refers to operation(s) that involve depositing a first conductive liner into the recesses formed in operation 404 and into the trench formed in operation 406, in order to form a first capacitor plate, which may correspond to the view of the high-density integrated circuit shielding and decoupling capacitor structure illustrated in stage 5(b), FIG. 5, and the associated description of that stage. According to embodiments, the first conductive liner is deposited onto the side(s) and bottom of the recesses and onto the side(s) and bottom of the trench, which is useful for creating an electrical connection between the first electrically conductive connector structure and the first conductive liner/plate. Creating an electrical connection can be useful for connecting high-density integrated circuit shielding and decoupling capacitor structure to a power, ground or signal node within the IC.

According to embodiments, process(es) used to deposit the first conductive liner/plate can be consistent with processes used to deposit conductive material within metal layers of an IC. Similarly, materials, e.g., various metals, used to create the first conductive liner can be consistent with metals used to line cavities of electrical interconnect structures, such as vias, within an IC. According to process operations used in IC fabrication, photolithographic techniques involving the use of photomasks and photoresist can be employed in operation 408 in order to restrict an area for the deposition of the first conductive liner. Alternatively, the first conductive liner/plate may be deposited globally. Once the conductive liner has been deposited into the recesses and trench, the process moves to operation 410.

Operation 410 generally refers to operation(s) that involve depositing a conformal dielectric film onto the first conductive liner or plate into the recesses and into the trench, which may correspond to the view of the high-density integrated circuit shielding and decoupling capacitor structure illustrated in stages 5(c)-(d), FIG. 5, and the associated descriptions of those stages Depositing a conformal dielectric film into the recesses and into the trench creates a dielectric layer, which can be useful for providing electrical insulation between the plates of a high-density integrated circuit shielding and decoupling capacitor structure. A conformal dielectric film that has a relatively high dielectric constant can enable creation of a high-density integrated circuit shielding and decoupling capacitor structure having a significantly higher capacitance value than that of an identical capacitor structure created with other types of dielectric films. According to embodiments, a conformal dielectric film can provide a surface on which to subsequently form and attach a second plate of the high-density integrated circuit shielding and decoupling capacitor structure. Once the conformal dielectric film is deposited onto the first conductive liner, the process 400 moves to operation 412.

Deposition of the conformal dielectric film during operation 410, like the deposition of the first conductive liner or plate during operation 408, may be performed globally (i.e., over the entire IC). Alternatively, deposition of the conformal dielectric film during operation 410 may be performed locally. According to process operations used in IC fabrication, photolithographic techniques involving the use of photomasks and photoresist can be employed in operation 410 in order to restrict an area for the deposition of the conformal dielectric film.

In some embodiments, a portion of the conformal dielectric film that is deposited globally, during operation 410, on the first conductive liner or plate may be subsequently removed locally, for example through an etching or polishing process. For example, patterning with a mask/photoresist and etch process may be performed to remove a portion of the conformal dielectric film. Removal of a portion of the conformal dielectric film from the first conductive liner or plate can be useful in portions of the IC that do not include the high-density integrated circuit shielding and decoupling capacitor structure. For example, a portion of the conformal dielectric film that is deposited globally, during operation 410, on the top surface of the first conductive liner or plate may be subsequently removed locally, for example through an etching or polishing process, in a portion of an IC that includes switched-signal wires (e.g., in the wire and via structure 106 of the second portion 102 of the IC 100, FIGS. 1-3). Such a removal operation may, for example, correspond to the view of the wire and via structure illustrated in stage 6(d), FIG. 6.

Operation 412 generally refers to the process operation(s) that involve filling the recesses and the trench with conductive material to form a second capacitor plate, which may correspond to the view of the high-density integrated circuit shielding and decoupling capacitor structure illustrated in stages 5(e), FIG. 5, and the associated description of those stages.

According to embodiments, a second plate of the high-density integrated circuit shielding and decoupling capacitor structure can be formed by filling a portion of the recesses and the trench that is not filled by the conformal dielectric film with an electrically conductive material, e.g., metal, that is electrically insulated from the first plate by the conformal dielectric film deposited in operation 410.

Consistent with operation 412, the second plate of the high-density integrated circuit shielding and decoupling capacitor structure can be formed using conductive material deposition process(es), including photolithographic operations and materials consistent with processes and materials used in creating conductive structures within ICs. Once the recesses and the trench are filled with an electrically conductive material, the process 400 moves to operation 414.

Operation 414 generally refers to the process operation(s) that involve polishing or planarizing the second plate, which may correspond to the view of the high-density integrated circuit shielding and decoupling capacitor structure illustrated in stage 5(f), FIG. 5, and the associated descriptions of that stage. Following filling the recesses and the trench with an electrically conductive material in operation 412, the top surface of the electrically conductive material can be polished or planarized using, for example, a chemical-mechanical polishing (CMP) process. Polishing or planarizing the electrically conductive material can be useful in providing a substantially planar top surface, which can facilitate subsequent IC processing operations such as deposition of dielectric and metal layers. Once the recesses and the trench are filled with an electrically conductive material in operation 412, and the top surface of the electrically conductive material polished or planarized in operation 414, the process 400 may end at block 416.

FIG. 5 is a flow diagram 500 illustrating, using successive partial cross-sectional views through stages 5(a)-5(f), the results of process operations shown in FIG. 4 for fabricating the high-density integrated circuit shielding and decoupling capacitor structure 104 illustrated in FIGS. 1-3, according to embodiments of the present disclosure. These views illustrate an example process; other views and operations can be possible. A high-density integrated circuit shielding and decoupling capacitor structure formed by these process operations can be consistent with the high-density integrated circuit shielding and decoupling capacitor structure 104, FIGS. 1-3, and can have a high capacitive density per unit of chip dielectric surface area.

The results of one or more process operations may be depicted in each stage. For example, a stage can depict the results of an etching process, which can also include photomask operations (apply, expose, develop, remove) that support the etching process. Processing operations associated with stages 5(a)-5(f) can include, but are not limited to etching, material layer deposition, layer planarization/polishing, photolithographic masking processes and insulator/oxide growth or deposition.

Completed structures may be generally shown in stages 5(a)-5(f) as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

The relatively high permittivity values of various dielectric materials such as $HfO_2$ or $Si_3N_4$ can make these materials useful in the fabrication of high-density integrated circuit shielding and decoupling capacitor structures. It can be understood that some level of material or chemical impurities may exist as a result of the use of a process designed to deposit or form a certain type of material, such as a dielectric layer. For example, in a process operation designed to deposit $HfO_2$, it can be appreciated that the material actually deposited may be substantially $HfO_2$, although some small amount of impurities can also be included, as an unintended result of the deposition process.

The stages 5(a)-5(f) can be useful in illustrating details involved in creating a high-density integrated circuit shielding and decoupling capacitor structure that has capacitive density greater than capacitive densities achievable through the creation of other capacitive structures. The operations depicted in the stages 5(a)-5(f) involve IC layers located above a semiconductor substrate, and such operations can be included in a back-end-of-line (BEOL) fabrication process for an IC.

Stage 5(a).

Stage 5(a) depicts the results of forming a recess 502 in a top surface 504 of a dielectric layer 226 of an IC and forming a trench 506 in a top surface 508 of an intra-metal dielectric portion 112 of a metal layer 224 (Mx+1) of the IC. The IC's dielectric and metal plane "stack" includes a first metal layer 222 (Mx), a second metal layer 224 (Mx+1) and a dielectric layer 226 interposed between the two metal layers. Metal layer 222 (Mx) and metal layer 224 (Mx+1) can be consistent with IC metal layers used for interconnecting active devices, e.g., transistors, and dielectric layer 226 can be consistent with IC dielectric layers used to provide electrical insulation between IC metal layers. Metal layer 222 (Mx) can be formed onto a substrate layer of the IC, e.g., 220, FIG. 2, and can include electrically conductive materials such as copper, cobalt, tungsten, aluminum or titanium. Dielectric layer 226 can be formed onto a metal layer, e.g., 222 (Mx), and can include electrically insulative materials such as $SiO_2$. Metal layer 224 (Mx+1) can be formed onto a dielectric layer, e.g., 226, and can include electrically conductive materials such as copper, cobalt, tungsten, aluminum or titanium. Metal layer 224 (Mx+1) can also include one or more intra-metal dielectric portions 112 of electrically insulative materials such as $SiO_2$. In certain embodiments, connector structure 230 within metal layer 222 (Mx) can be a portion of a wire. In some embodiments, connector structure 230 can be a region of metal designated solely for use in establishing an electrical connection to a high-density integrated circuit shielding and decoupling capacitor structure.

According to embodiments, recess 502 has at least one side and a bottom, and the bottom is located adjacent to a first electrically conductive structure 230. In embodiments, the recess 502 can have a variety of outline shapes, as viewed from a top view, e.g., 122, FIG. 1, such as round, square, rectangular or other polygonal shapes. In some embodiments, the recess sides can be oriented substantially orthogonal to a dielectric layer top surface, and in other embodiments, the sides can be sloped relative to the top surface of the dielectric layer 226, according to a type of etch process used to form the recess. The operation of forming the recess 502, along with the other recesses of the high-density integrated circuit shielding and decoupling capacitor structure, in the dielectric layer 226 can include the use of etching processes consistent with processes used for via formation in an IC dielectric layer, including dry etching, plasma etching, anisotropic etching or reactive ion etching (RIE). In embodiments, forming the recess 502 can involve applying a photomask to define recess boundaries, exposing and developing lines in the photoresist, etching the recess 502 in the dielectric layer 226, and stripping off the remaining photomask. According to embodiments, the dimensions of the recess 502 can be consistent with dimensions of vias used in electrical interconnections between metal layers within an IC.

According to embodiments, trench 506 has at least one side and a bottom, and the bottom is located adjacent to the recess 502 and the other recesses of the high-density integrated circuit shielding and decoupling capacitor structure. In embodiments, the trench 506 can have a variety of outline shapes, as viewed from a top view, e.g., 104, FIG. 1, such as straight line, bent, curved or other shapes. In some embodiments, the recess sides can be oriented substantially orthogonal to a metal layer top surface, and in other embodiments, the sides can be sloped relative to the top surface of the metal layer 224 (Mx+1), according to a type of etch process used to form the trench. The operation of forming the trench 506 in the intra-metal dielectric portion 112 of the metal layer 224 (Mx+1) can include the use of etching processes consistent with processes used for wire formation in an IC dielectric layer, including dry etching, plasma etching, anisotropic etching or reactive ion etching (RIE). In embodiments, forming the trench 506 can involve applying a photomask to define trench boundaries, exposing and developing lines in the photoresist, etching the trench 506 in the intra-metal dielectric portion 112 of the metal layer 224, and stripping off the remaining photomask. According to embodiments, the dimensions of the trench 506 can be consistent with dimensions of wires of metal layers within an IC.

Stage 5(*b*).

Stage 5(*b*) depicts the results of depositing a first conductive liner 510 onto at least one side and the bottom of the recess 502 (and onto at least one side and the bottom of the other recesses 502 of the high-density integrated circuit shielding and decoupling capacitor structure 104) and onto at least one side and the bottom of the trench 506 to form a first plate of the high-density integrated circuit shielding and decoupling capacitor structure. A first conductive liner 510 can be useful in promoting adhesion of the conformal dielectric film 512, stage 5(*c*), to the dielectric layer 226 and to the intra-metal dielectric portion 112 of the metal layer 224 (Mx+1), and can also mitigate the diffusion of electrically conductive material 514, e.g., metal, into the dielectric layer 226 and into the intra-metal dielectric portion 112 of the metal layer 224 (Mx+1). In embodiments, the first conductive liner 510 deposited within the recess 502 and within the intra-metal dielectric portion 112 of the metal layer 224 (Mx+1) can have a greater surface area than a corresponding parallel plate capacitor created within the same surface area of a dielectric layer. This increased surface area can be useful in increasing the capacitance and capacitive density of high-density integrated circuit shielding and decoupling capacitor structure fabricated according to embodiments. Depositing a first conductive liner 510 into the recess 502 can be useful for creating an electrical connection between the first connector structure 230 and the first conductive liner 510.

The operation of depositing a first conductive liner 510 onto at least one side and the bottom of the recess 502 and onto at least one side and the bottom of the trench 506 can include the use of processes consistent with processes used for metal deposition in an IC metal layer, including a physical vapor deposition (PVD) process, cathodic arc deposition, or a chemical vapor deposition (CVD) process. According to embodiments, the first conductive liner 510 can include electrically conductive material, such as TiN, which can have a substantially uniform thickness when deposited onto at least one side and the bottom of the recess 502 and onto at least one side and the bottom of the trench 506. In some embodiments, first conductive liner 510 can also be deposited on the top surface of the intra-metal dielectric portion 112 of the metal layer 224 (Mx+1), or even globally, during stage 5(*b*).

Stage 5(*c*).

Stage 5(*c*) depicts the results of depositing a conformal dielectric film 512 onto the first conductive liner 510. Conformal dielectric film 512 materials can include $Si_3N_4$ and $HfO_2$, which can have a relatively high dielectric constant, for example, between 7.5 and 28. Such materials can be useful for providing increased capacitance values for high-density integrated circuit shielding and decoupling capacitor structures, relative to capacitor structures created with lower dielectric constants. For example, $HfO_2$, having a relatively high dielectric constant or $k \approx 28$, can enable, in conjunction with higher plate surface areas of high-density integrated circuit shielding and decoupling capacitor structures, a high-density integrated circuit shielding and decoupling capacitor structure to have a significantly higher capacitance value than one created with a dielectric film such as $SiO_2$, with a $k \approx 3.9$.

The operation of depositing a conformal dielectric film 512 onto the first conductive liner 510 can include the use of deposition processes consistent with processes used for conformal film deposition in an IC, including plasma oxidation, CVD, or a variant such as plasma-enhanced chemical vapor deposition (PECVD). In some embodiments, a photolithographic process can also be used to define suitable areas for conformal film deposition. In some embodiments, the conformal dielectric film 512 can also be deposited on deposited on the top surface of the intra-metal dielectric portion 112 of the metal layer 224 (Mx+1), or even globally, during stage 5(c).

Stage 5(d).

Stage 5(d) is identical to stage 5(c). Stage 5(d) depicts the result of the locally removing, but in other portions of the IC, a portion of the conformal dielectric film that is deposited globally in stage 5(c). For example, a portion of the conformal dielectric film 512 that is deposited globally, in stage 5(c), may be removed locally (e.g., in stage 6(d), FIG. 6), for example through an etching or polishing process, in other portions of the IC, such as the second portion 102 of the IC 100 in which the wire and via structure 106 is to be formed (as opposed to the first portion 101 of the IC 100 in which the high-density integrated circuit shielding and decoupling capacitor structure 104 is to be formed).

Stage 5(e).

Stage 5(e) depicts the results of filling a portion of the recess 502 (and the other recesses 502 of the high-density integrated circuit shielding and decoupling capacitor structure 104) and the trench 506 that is not filled by the conformal dielectric film 512 with electrically conductive material 514 to form a second plate of the high-density integrated circuit shielding and decoupling capacitor structure. According to embodiments, conductive material 514 is electrically insulated, by the conformal dielectric film 512 from the first conductive liner/plate 510.

The operation of filling the recess 502 (and the other recesses 502 of the high-density integrated circuit shielding and decoupling capacitor structure 104) and the trench 506 with electrically conductive material 514 can include the use of processes consistent with processes used for metal deposition in an IC metal layer, including a PVD process, cathodic arc deposition, or a CVD process.

Stage 5(f).

Stage 5(f) depicts the results of using a polish or etch operation to planarize or level the top surface of the high-density integrated circuit shielding and decoupling capacitor structure. This planarization or leveling operation can include a CMP process, or other subtractive process such as milling, machining, or laser ablation. The planarization process can be useful in achieving a uniform specified flatness across the top surface of the electrically conductive material 514, in accordance with IC manufacturing tolerances and specifications.

In certain embodiments, a CMP process can be employed to partially planarize the top surface of the high-density integrated circuit shielding and decoupling capacitor structure, in conjunction with a subsequent "wet", or chemical, etch process to complete the deposited material removal. Use of CMP planarization followed by wet etching can be useful for reducing possible chemical contamination of metal and dielectric material layers through the use of a CMP process alone.

Figure 6:
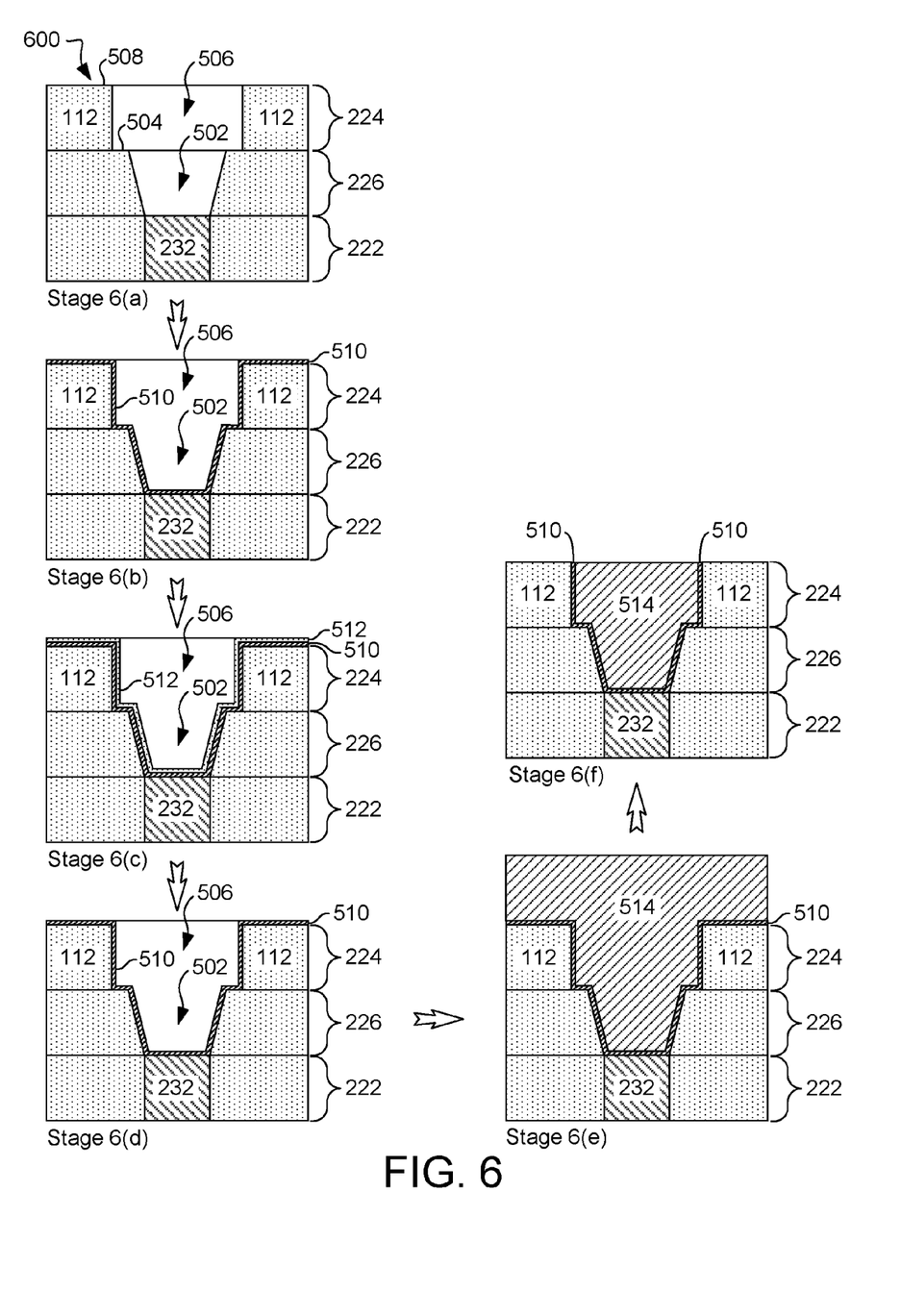
FIG. 6 is a flow diagram illustrating, using successive partial cross-sectional views through stages 6(a)-6(f), the results of process operations for fabricating a wire and via structure illustrated in FIG. 2 (right side), according to embodiments of the present disclosure.

FIG. 6 is a flow diagram 600 illustrating, using successive partial cross-sectional views through stages 6(a)-6(f), the results of process operations for fabricating a wire and via structure 106 illustrated in FIGS. 1-3, according to embodiments of the present disclosure. These views illustrate an example process; other views and operations can be possible. A wire and via structure formed by these process operations can be consistent with the wire and via structure 106, FIGS. 1-3.

The process operations used in FIG. 6 are identical to those used in FIG. 5, with one exception. The exception is that in stage 6(d), the conformal dielectric film 512 is removed locally. In one embodiment, the conformal dielectric film 512 may be deposited globally, in stage 6(c), on the top surface of the first conductive liner or plate, and then a portion of the globally deposited conformal dielectric film 512 may be removed locally, in stage 6(d), for example through an etching or polishing process. For example, in stage 6(d), patterning with a mask/photoresist and etch process may be performed to remove the conformal dielectric film 512 from within the recesses and the trench in the second portion 102 of the IC 100 in which the wire and via structure 106 illustrated in FIGS. 1-3 is to be formed.

One skilled in the art will appreciate that many variations are possible within the scope of the present invention. Thus, while the present invention has been particularly shown and described with reference to some embodiments thereof, it will be understood by those skilled in the art that these and other changes in form and detail may be made therein without departing from the spirit and scope of the present invention.

What is claimed is:

1. A method for fabricating a shielding and decoupling capacitor structure within an integrated circuit (IC), the method comprising:
   forming a plurality of recesses in a top surface of a dielectric layer of the IC, each recess having at least one side and a bottom, the bottom of each of the plurality of recesses exposing a first conductive structure;
   forming a trench in a top surface of a first intra-metal dielectric portion of a metal layer of the IC deposited on the top surface of the dielectric layer, the trench having at least one side and a bottom, the bottom of the trench exposing each of the plurality of recesses formed in the dielectric layer;
   forming a first plate of the shielding and decoupling capacitor structure by depositing a first electrically conductive liner onto the at least one side and the bottom of each of the recesses formed in the dielectric layer and onto the at least one side and the bottom of the trench formed in the first intra-metal dielectric portion of the metal layer;
   depositing a conformal dielectric film onto the first plate within the trench and each of the plurality of recesses;
   forming a second plate of the shielding and decoupling capacitor structure by depositing an electrically conductive material within the trench and each of the plurality of recesses over the conformal dielectric film, the second plate electrically insulated from the first plate by the conformal dielectric film.

2. The method as recited in claim 1, wherein the conformal dielectric film has a dielectric constant between 7.5 and 28.

3. The method as recited in claim 1, wherein the second plate of the shielding and decoupling capacitor structure comprises a DC signal wire that runs along the trench.

4. The method as recited in claim 3, wherein the plurality of recesses formed in the dielectric layer are arranged in at least one row that underlies the DC signal wire.

5. The method as recited in claim 1, wherein the second plate of the shielding and decoupling capacitor structure comprises a power supply wire that runs along the trench.

6. The method as recited in claim 5, wherein the plurality of recesses formed in the dielectric layer are arranged in at least one row that underlies the power supply wire.

7. The method as recited in claim 1, further comprising:
forming a plurality of recesses for vias in the top surface of the dielectric layer, each via recess having at least one side and a bottom, the bottom of each of the plurality of via recesses exposing a second conductive structure;
forming a trench for a switched-signal wire in a top surface of a second intra-metal dielectric portion of the metal layer deposited on the top surface of the dielectric layer, the switched-signal wire trench having at least one side and a bottom, the bottom of the switched-signal wire trench exposing each of the plurality of via recesses formed in the dielectric layer;
depositing a second electrically conductive liner onto the at least one side and the bottom of each of the via recesses formed in the dielectric layer and onto the at least one side and the bottom of the switched-signal wire trench formed in the second intra-metal dielectric portion of the metal layer, wherein depositing the second electrically conductive liner occurs simultaneously with depositing the first electrically conductive liner;
depositing a conformal dielectric film onto the second electrically conductive liner within the switched-signal wire trench and each of the plurality of via recesses, wherein depositing the conformal dielectric film onto the second electrically conductive liner occurs simultaneously with depositing the conformal dielectric film onto the first electrically conductive liner;
removing the conformal dielectric film deposited onto the second electrically conductive liner within the switched-signal wire trench and each of the plurality of via recesses to expose the second electrically conductive liner within the switched-signal wire trench and each of the plurality of via recesses;
forming a third conductive structure by depositing an electrically conductive material within the switched-signal wire trench and each of the plurality of via recesses over the second electrically conductive liner, wherein forming the third conductive structure occurs simultaneously with forming the second plate of the shielding and decoupling capacitor structure.

8. The method as recited in claim 7, wherein the second plate of the shielding and decoupling capacitor structure comprises a DC signal wire that runs along the trench, and wherein the third conductive structure comprises an aggressor wire that runs along the switched-signal wire trench and is adjacent to the DC signal wire.

9. The method as recited in claim 8, wherein the plurality of recesses formed in the dielectric layer are arranged in at least one row that underlies the DC signal wire, and wherein the plurality of via recesses formed in the dielectric layer are arranged in at least one row that underlies the aggressor wire.

10. The method as recited in claim 7, wherein the second plate of the shielding and decoupling capacitor structure comprises a power supply wire that runs along the trench, and wherein the third conductive structure comprises an aggressor wire that runs along the switched-signal wire trench and is adjacent to the power supply wire.

11. The method as recited in claim 10, wherein the plurality of recesses formed in the dielectric layer are arranged in at least one row that underlies the power supply wire, and wherein the plurality of via recesses formed in the dielectric layer are arranged in at least one row that underlies the aggressor wire.

* * * * *